United States Patent [19]
Murase et al.

[11] Patent Number: 5,442,137
[45] Date of Patent: Aug. 15, 1995

[54] SUPERCONDUCTOR WIRE AND METHOD OF MANUFACTURING THE SAME

[75] Inventors: Satoru Murase; Shigeo Nakayama, both of Yokohama, Japan

[73] Assignee: Kabushiki Kaisha Toshiba, Kawasaki, Japan

[21] Appl. No.: 796,380

[22] Filed: Nov. 22, 1991

[30] Foreign Application Priority Data

Nov. 22, 1990 [JP] Japan .................. 2-320117
May 17, 1991 [JP] Japan .................. 3-113082

[51] Int. Cl.$^6$ .................................... H01B 12/02
[52] U.S. Cl. ................... 174/125.1; 505/884; 505/887
[58] Field of Search .............. 174/125.1, 15.4, 15.5; 29/599; 505/884, 886, 887

[56] References Cited

U.S. PATENT DOCUMENTS

| | | | |
|---|---|---|---|
| 3,504,105 | 3/1970 | Bogner et al. | 174/125.1 |
| 3,614,301 | 10/1971 | Royet | 174/125.1 |
| 4,426,550 | 1/1984 | Luhman et al. | 29/599 X |
| 4,490,578 | 12/1984 | Suzuki et al. | 174/15.5 |
| 4,568,900 | 2/1986 | Agatsuma et al. | 174/15.5 |
| 4,586,012 | 4/1986 | Kotzumi et al. | 174/125.1 X |

FOREIGN PATENT DOCUMENTS

| | | | |
|---|---|---|---|
| 0377294 | 7/1990 | European Pat. Off. | |
| 0141107 | 11/1981 | Japan | 174/125.1 |
| 0087424 | 3/1990 | Japan | 174/125.1 |
| 0186510 | 6/1990 | Japan | 174/125.1 |
| 1199549 | 7/1970 | United Kingdom | 29/599 |

OTHER PUBLICATIONS

D. S. Easton & D. M. Kroeger, "Kirkendall Voids-A Detrimental To Nb3Sn SuperConductors", Jan. 1979, IEEE Transactions on Magnetics, vol. Mag-15, No. 1, pp. 178-181.

K. Kuroda, "Superconducting coils impregnated with Wood's Metal", Nov. 1975, Cryogenics, pp. 675-677.

Patent Abstracts Of Japan, vol. 15, No. 379, (E-1115), Sep. 25, 1991, & JP-A-3 150 806, K. Hamashima, "Superconductor".

Proceedings Of The International Cryogenic Materials Conference, pp. 215-218, "High-Current MF Nb3Sn Conductor for Up-Grading Of The Cluster Test Facility", (1982), S. Murase, et al.

Proceedings Of The Tenth International Cryogenic Engineering Conference, pp. 704-707, "Titanium Bronze Processed Nb3Sn Conductor Performance Of 12 T Superconducting Magnet For 30 T Hybrid Magnet" (1984), S. Murase et al.

*Primary Examiner*—Leo P. Picard
*Assistant Examiner*—H. S. Sough
*Attorney, Agent, or Firm*—Oblon, Spivak, McClelland, Maier & Neustadt

[57] ABSTRACT

A housing is arranged outside a superconducting wire body to enclose it at a predetermined gap. A solder layer and/or a space are formed as a stress relaxation layer between the superconducting wire body and the housing. The gap between a surface of the superconducting wire body, to which a load acts in a direction perpendicular to the longitudinal direction of the superconducting wire body, and a housing material layer, is set to at least 0.25 mm at each side. Alternatively, a solder layer is formed to leave a space between a surface of the superconducting wire body, to which the above load mainly acts, and the housing material layer.

19 Claims, 8 Drawing Sheets

SUPERCONDUCTOR WIRE AND METHOD OF MANUFACTURING THE SAME

BACKGROUND OF THE INVENTION

1. Field of the Invention

The present invention relates to a superconducting wire exhibiting a stable characteristic even when an external pressure such as a load is applied, and a method of manufacturing the same.

2. Description of the Related Art

For example, it is known that, in a superconducting wire of a metal compound superconductor such as $Nb_3Sn$, its superconducting characteristic is degraded when a tensile stress in the longitudinal direction or a compressive stress (a load in a direction perpendicular to the longitudinal direction, or a lateral compressive stress) within a section is applied. In particular, regarding the lateral compressive stress, the superconducting characteristic, e.g., a critical current density, is easily degraded when a stress of as small as about 1/10 the tensile stress in the longitudinal direction is applied.

A superconducting wire of this type is, e.g., wound in a coil manner and used in practice as a large-size, high-magnetic field superconducting magnet device for nuclear fusion or for a hybrid magnet or the like. In the case of the large-size, high-magnetic field superconductor magnet device, it is demanded that the magnet device has such a structure to protect the superconducting wire itself from a strong magnetic force or to restore a superconducting state when the superconducting state is once shifted to the normal conducting state. For this purpose, a housing material made of, e.g., copper, serving as a stabilizing material and a reinforcing material is used to cover the superconducting wire body. In more detail, a housing material layer is soldered on a circumferential surface of the superconducting wire body, thereby constituting a superconducting wire.

In such a superconducting wire in which the housing material layer is soldered on the circumferential surface of the superconducting wire body, the gap between the housing material layer and the superconducting wire body is set as small as possible, e.g., about 0.1 mm or less, in order to keep good electrical contact and to improve the mechanical strength of the entire superconducting wire.

Figure 1:
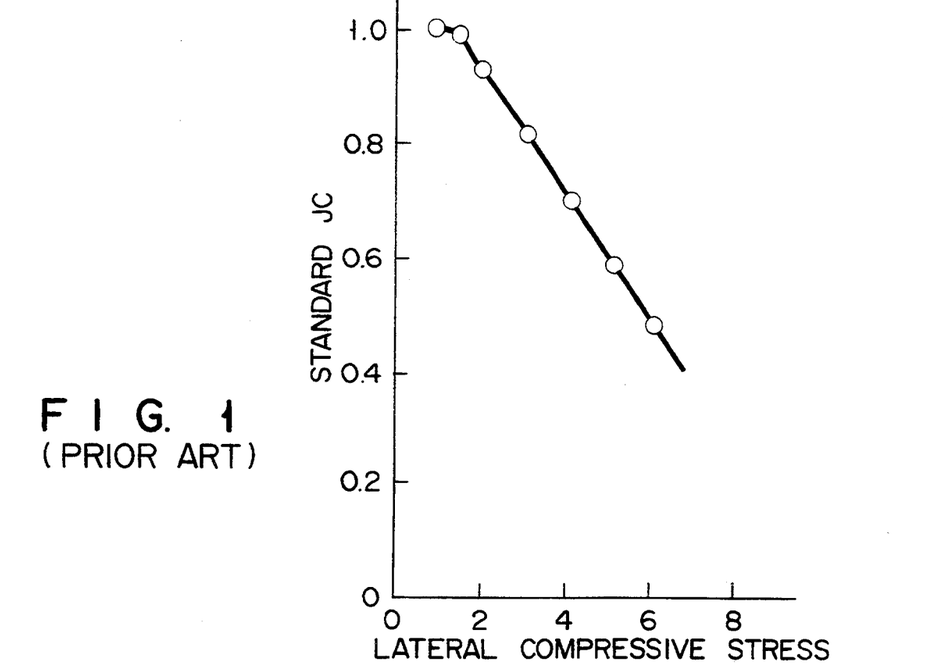
FIG. 1 is a graph showing a relationship between the critical current density and the lateral compressive stress of a conventional superconducting wire.

However, when the superconducting wire described above which is constituted by soldering the superconducting wire body and the housing material layer through a small gap is wound in a coil manner, although the housing material is strong against a hoop stress (which acts as a tensile stress in the longitudinal direction of a conductor) which is generated by an electromagnetic force, it has substantially no effect in reinforcement against a lateral force, as shown in FIG. 1 (this will be described later in detail as a comparative example).

Therefore, in coil design and the like, the following techniques are employed:
(a) to increase the spacer ratio; and
(b) to set the height of the coil located at the innermost layer to be lower than that of the coil at the outermost layer, thereby decreasing the lateral compressive stress.

In the case of (a), however, since the stability is decreased, the reliability in terms of function is impaired. In the case of (b), since the coil design and the coil structure itself become complicated, the cost is largely increased.

SUMMARY OF THE INVENTION

The present invention has been made in view of the above situation, and has as its object to provide a superconducting wire which is durable against the hoop stress (which serves as a tensile stress in the longitudinal direction of the conductor) generated by an electromagnetic force and a lateral compressive stress when it is constituted as a coil, thereby exhibiting a constant, stable performance. It is another object of the present invention to provide a superconducting wire manufacturing method which can manufacture such a superconducting wire with good reproducibility.

The above objects are realized by a superconducting wire comprising:
  a housing including at least one significant space;
  a superconducting wire body arranged in the housing, so as to leave the significant space in the housing; and
  a material filled in the significant space.

The above objects are also realized by a superconducting wire comprising:
  a housing including at least one significant space;
  a superconducting wire body arranged in the housing, so as to leave the significant space in the housing; and
  a material filled in the significant space to leave a predetermined space.

The above objects are also realized by a superconducting wire comprising:
  a housing including at least one significant space;
  a superconducting wire body arranged in the housing, so as to leave the significant space in the housing;
  a linear member arranged in the significant space; and
  a material filled in the significant space.

The above objects are also realized by a method of manufacturing a superconducting wire, comprising the steps of:
  arranging a superconducting wire body in a housing, so as to leave the significant space in the housing; and
  filling a material in the significant space.

The above objects are also realized by a method of manufacturing a superconducting wire, comprising the steps of:
  arranging a superconducting wire body in a housing through a significant space; and
  filling a material in the significant space to leave a predetermined space.

The above objects are also realized by a method of manufacturing a superconducting wire, comprising the steps of:
  arranging a superconducting wire body in a housing, so as to leave the significant space in the housing;
  arranging a member in the significant space; and
  filling a material in the significant space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The preferred embodiments of the present invention will be described with reference to the accompanying drawings.

Figure 2:
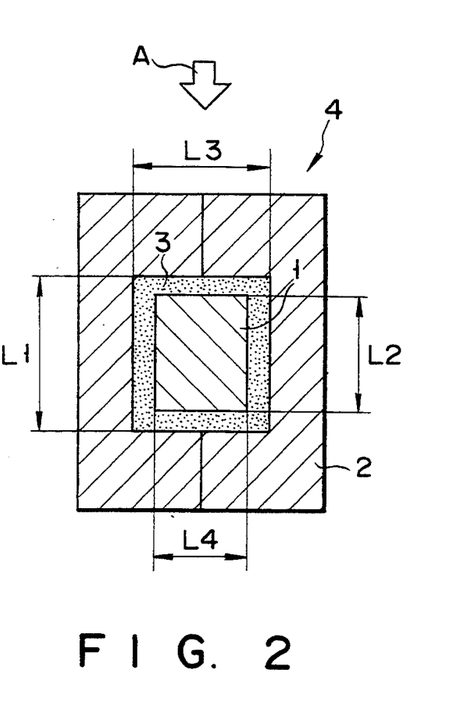
FIG. 2 is a sectional view showing the structure of a superconducting wire according to an embodiment of the present invention.

FIG. 2 is a sectional view showing the structure of a superconducting wire according to an embodiment of the present invention. As shown in FIG. 2, an $(Nb,Ti)_3Sn$ superconducting wire body 1 and a housing material layer 2 are integrated by a solder layer 3 to constitute a superconducting wire 4. The $(Nb,Ti)_3Sn$ superconducting wire body 1 is of a copper matrix type having a straight-angled section. The $(Nb,Ti)_3Sn$ superconducting wire body 1 is enclosed by the housing material layer 2.

The housing material layer 2 serves as a stabilizing member and a strength reinforcing member. As the material of this housing material layer 2, e.g., copper reinforced to ½ H or alumina-dispersed reinforced copper is used, and the layer 2 is divided into two portions along the lengthwise direction. Alumina-dispersed reinforced copper is a reinforced Cu alloy in which $Al_2O_3$ particles are dispersed in Cu in a range of about 0.2 to 1.6 wt. %, and is obtained by, e.g., sintering a mixture of a copper oxide powder and an alumina powder in a reduction atmosphere.

The housing material layer 2 is arranged to provide a predetermined gap between the superconducting wire body 1 and itself. For example, a Pb-Sn, In, Ag, Cd solder or an alloy as a combination thereof is filled in this gap, thereby forming the solder layer 3.

In the superconducting wire 4 having the above structure, it is preferable that the gap between the $(Nb,Ti)_3Sn$ superconducting wire body 1 and a housing material layer 2 covering it, in other words, the thickness of the solder layer 3 is set such that the gap between a surface of the superconducting wire body 1, on which a load (indicated by an arrow A in FIG. 2) in at least the vertical direction acts, and the housing material layer 2 becomes 0.25 mm or more. That is, when the superconducting wire 4 is coiled as an electromagnet device or the like, regarding the region of a surface of the superconducting wire 4 to which at least a load in the vertical direction acts in the direction of the axis of the coiled superconducting wire 4, it is preferable that the gap between the superconducting wire body 1 and the housing material layer 2 is set to 0.25 mm or more, and more preferably to 0.3 mm or more. The upper limit of the gap between the superconducting wire body 1 and the housing material layer 2 covering it is preferably about 0.65 mm because degradation due to a tensile stress occurs if the gap exceeds 0.7 mm.

In this manner, when the gap between the surface of the superconducting wire body 1, to which at least the vertical load acts, and the housing material layer 2 is set to 0.25 mm or more, the solder layer 3 filled and formed in this gap sufficiently serves as a stress relaxation layer. Therefore, degradation in superconducting characteristic caused by application of the stress can be suppressed.

In the above embodiment, the $(Nb,Ti)_3Sn$ superconducting is used. However, the present invention is not limited to this. The same effect can be obtained if a superconductor made of $Nb_3Al$ or an A15-type compound as its substituted product, a Y-, Bi-, or Ti-based oxide superconductor, or a superconductor made of a Chevrel compound having Pb-Mo-S as major components is used.

Figure 3:
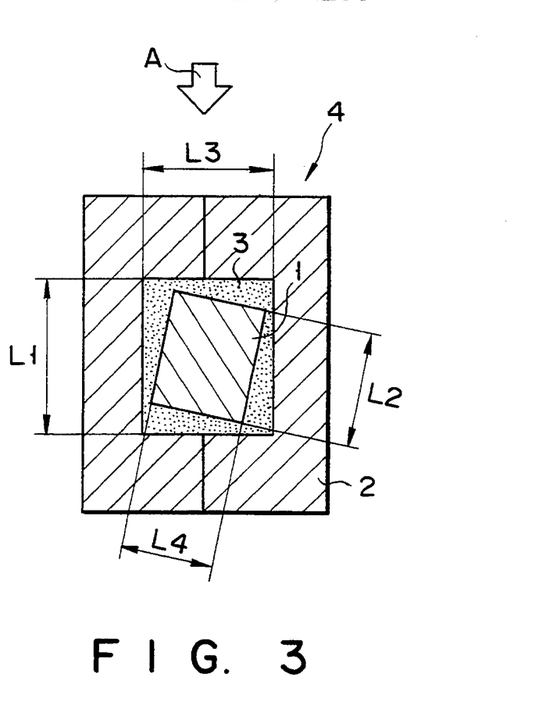
FIG. 3 is a sectional view showing a modification of the superconducting wire shown in FIG. 2.

If the superconducting wire body 1 is arranged to be slightly inclined with respect to the housing material layer 2 covering it, as shown in FIG. 3, no problem arises. When the superconducting wire body 1 is to be inserted in the housing material layer 2, it will not be set at an ideal central position. Accordingly, note that a gap on one side in this invention is ½ the total gap of the vertical or horizontal direction. That is, in FIG. 2, the gap with respect to a surface (one side) to which a load acts is $(L_1-L_2)/2$, and the gap on a side of the wider surface is $(L_3-L_4)/2$. The same calculation applies to FIG. 3. Reference symbol $L_1$ denotes an inner size of the housing material layer 3 on the wider surface side; $L_3$, an inner size thereof on a narrower surface side; $L_2$, the size of the superconducting wire body 1 on the wider surface side; and $L_4$, the size thereof on a narrower surface side. Regarding the solder layer 3, the corresponding gap can be completely filled with a solder. In particular, if $(L_1-L_2)/2$ or $(L_3-L_4)/2$ exceeds 0.1 mm, it is difficult to completely fill the gap with a solder, and portions not filled with solder, i.e., voids are formed. However, it does not influence the characteristic described above. Inversely, it is preferable to form voids in the direction (portion) in which the load acts.

A practical arrangement of the superconducting wire 4 having the above structure and a result of its evaluation will be described.

A method of manufacturing the superconducting wire 4 according to Example 1 will be described first with reference to FIG. 4, and then a result of evaluation of the superconducting wire 4 manufactured in accordance with this method will be described.

Figure 4:
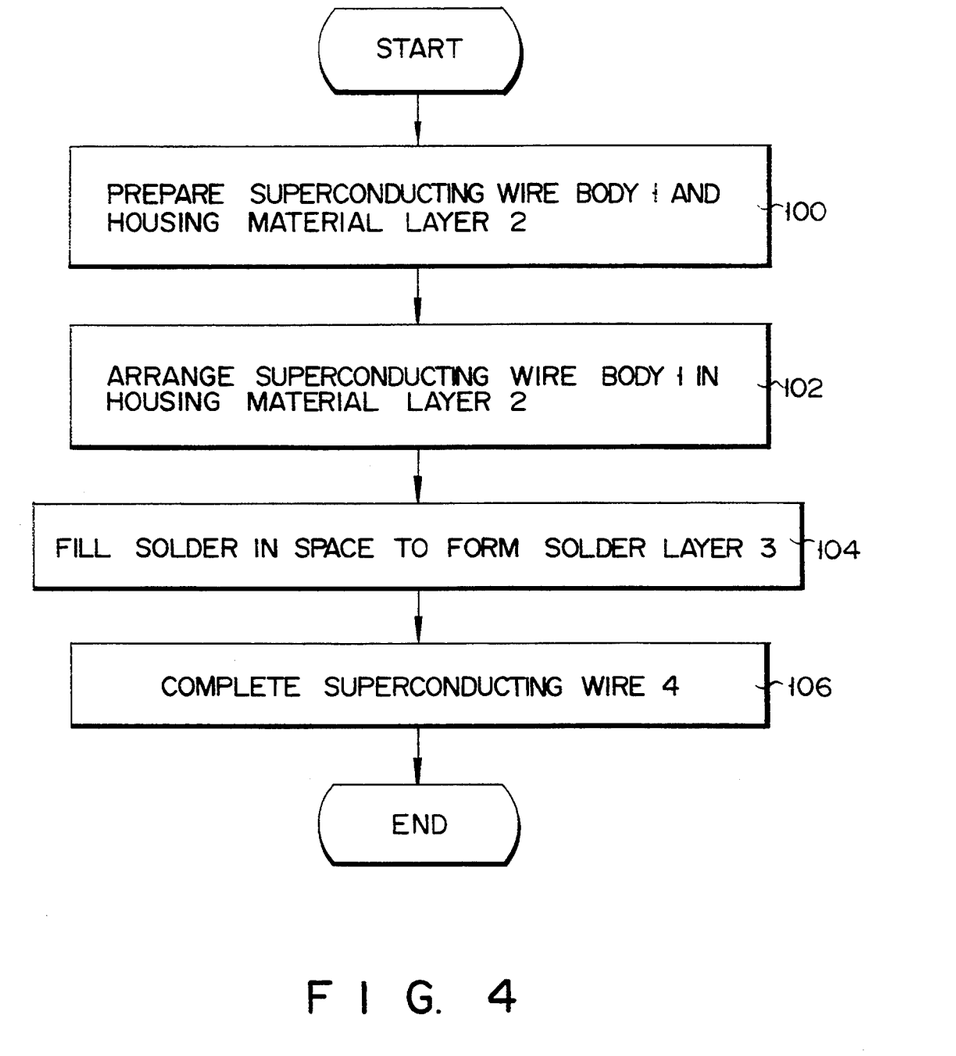
FIG. 4 is a flow chart showing Example 1 of a method of manufacturing a superconducting wire according to the present invention.

As shown in FIG. 4, the method of manufacturing the superconducting wire 4 consists of steps 100 to 106. A straight-angled $(Nb,Ti)_3Sn$ superconducting wire body 1 having a section of 0.7 mm × 1.4 mm and a housing material layer 2 ($\frac{1}{2}$ H reinforced copper) of a thickness of about 0.5 mm which covers the superconducting wire body 1 are prepared (step 100). The interior dimensions is given such that the vertical gap on both sides of a surface of the direction of the arrow A on which the load acts is 0.3 mm on each side and that the gap on the other wider surface side is about 0.05 to 0.1 mm on each side (step 102). The $(Nb,Ti)_3Sn$ superconducting wire body 1 is arranged in the housing material layer 2 such that its wider surfaces are located in the right-and-left direction in FIG. 2. A Pb-Sn solder is filled in this gap to form a solder layer 3 (step 104), and the superconducting wire 4 as shown in FIG. 2 (or FIG. 3) is fabricated (step 106).

Figure 5:
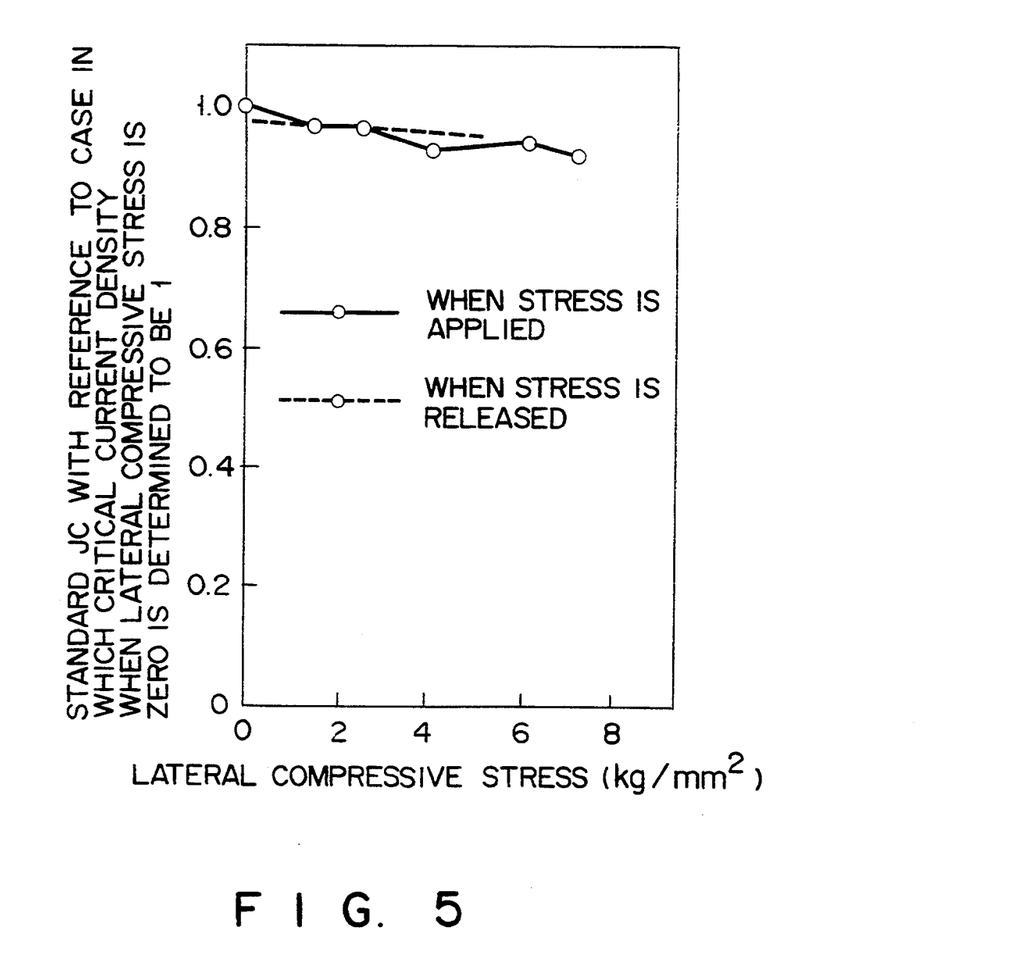
FIG. 5 is a graph showing a relationship between the critical current density and the lateral compressive stress of the superconducting wire according to the embodiment of the present invention.

The critical current density, obtained when a lateral compressive stress (in the direction of the arrow) was applied, was standardized (standard Jc) with reference to a critical current density at 14 tesla when the lateral compressive stress (in the direction of the arrow) was 0, and a relationship between a critical current density and a corresponding applied lateral compressive stress (in the direction of the arrow) was studied. FIG. 5 shows its result. Referring to FIG. 5, a hollow circle represents a measurement result when a stress is applied, and a solid circle represents a measurement result when the stress is released. As is apparent from FIG. 5, the critical current density was decreased by only about 5% when the lateral compressive stress was 6 kg/mm$^2$.

The present invention was compared with the conventional superconducting wire. That is, a conventional superconducting wire was manufactured so that an $(Nb,Ti)_3Sn$ superconducting wire body 1 is formed to have a straight-angled section of 0.7 mm × 1.4 mm, a housing material layer 2 covering it is formed to have a thickness of about 0.5 mm, and the gap between the superconducting wire body 1 and the housing material layer 2 is set to 0.1 mm entirely (throughout the circumferential surface), and that a Pb-Sn solder 3 is filled in this gap. Lateral compressive stresses were applied to this conventional superconducting wire, and the obtained critical current densities (standard Jc) were measured in the same manner as Example 1 of the present invention described above. The result is shown in FIG. 1. As is apparent from FIG. 1, when the lateral compressive stress was 6 kg/mm$^2$, the critical current density was decreased (degraded) by as much as about 50%. In this manner, the lateral compressive stress characteristic of the superconducting wire according to the present invention is improved by ten times that of the conventional superconducting wire (comparative example).

A method of manufacturing a superconducting wire 4 according to Example 2 of the present invention, and an evaluation result of the superconducting wire 4 manufactured in accordance with this method will be described.

In the structure shown in FIG. 2, an $(Nb,Ti)_3Sn$ superconducting wire body 1 was set to have a straight-angled section of 0.7 mm × 1.4 mm, and a housing material layer 2 covering it was set to have a thickness of about 0.5 mm. A gap between the superconducting wire body 1 and the housing material layer 2 was set to about 0.05 mm to 0.55 mm at each of the upper and lower surface sides to which a load acts in the direction of the arrow, and to about 0.05 mm to 0.15 mm at each of the right and left surface sides which are perpendicular to the direction of the arrow. A Pb-Sn solder was filled in this gap to form a solder layer 3, thereby manufacturing a superconducting wire 4. Six types of superconductor wires 4 were manufactured in this manner by changing the size of the gap.

Figure 6:
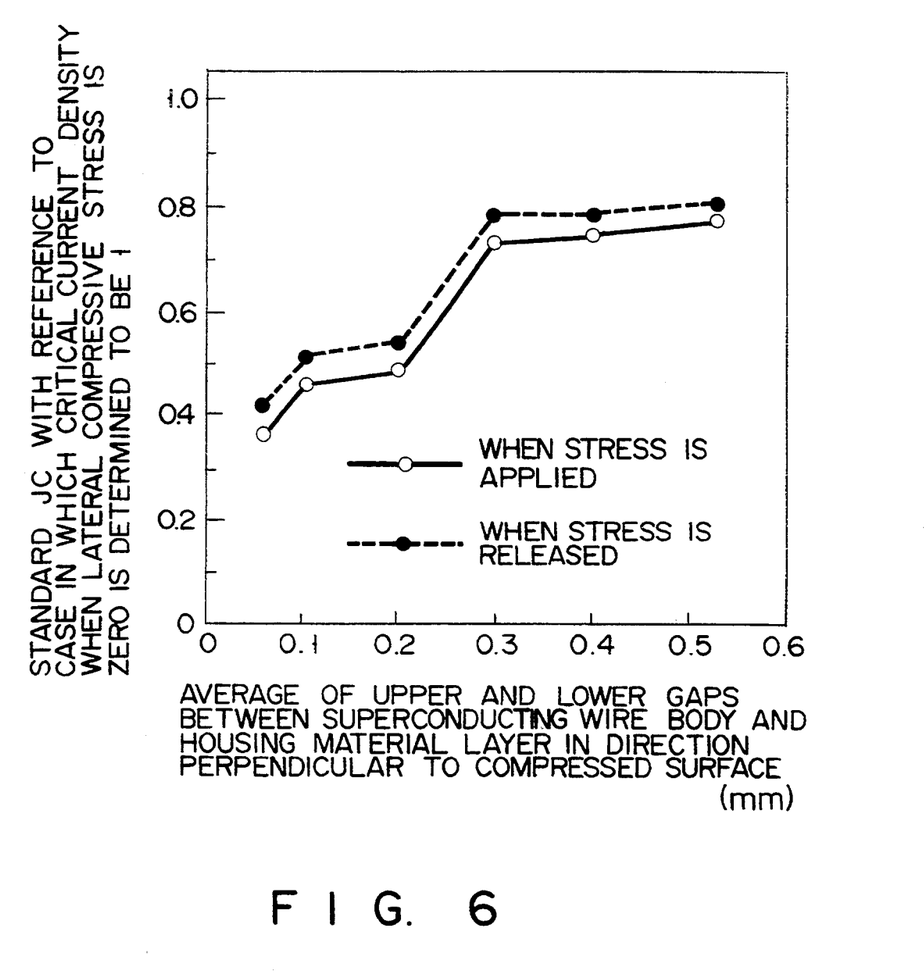
FIG. 6 is a graph showing a relationship between the critical current density and the superconducting wire body-housing material layer gap of the superconducting wire according to the embodiment of the present invention.

Lateral compressive stresses were applied to these superconducting wires 4, and the obtained critical current densities (standard Jc) were measured in the same manner as in Example 1. FIG. 6 shows the result as a relationship between the critical current density and an average of the compressive stress at upper and lower portions, along a direction perpendicular to the compressed surface, of the gap between the superconducting wire body 1 and the housing material layer 2. In FIG. 6, a hollow circle represents a measurement result when a stress was applied, and a solid circle represents a measurement result when the stress was released. As is apparent from FIG. 6, when the gap between the superconducting wire body 1 and the housing material layer 2 covering it is set to 0.25 mm or more (the upper limit is generally about 0.65 mm) at least on a side to which the lateral compressive stress acts, a decrease (degradation) in characteristic against the lateral compressive stress is greatly reduced and is improved.

A superconducting wire according to another embodiment of the present invention will be described with reference to FIG. 7.

Figure 7:
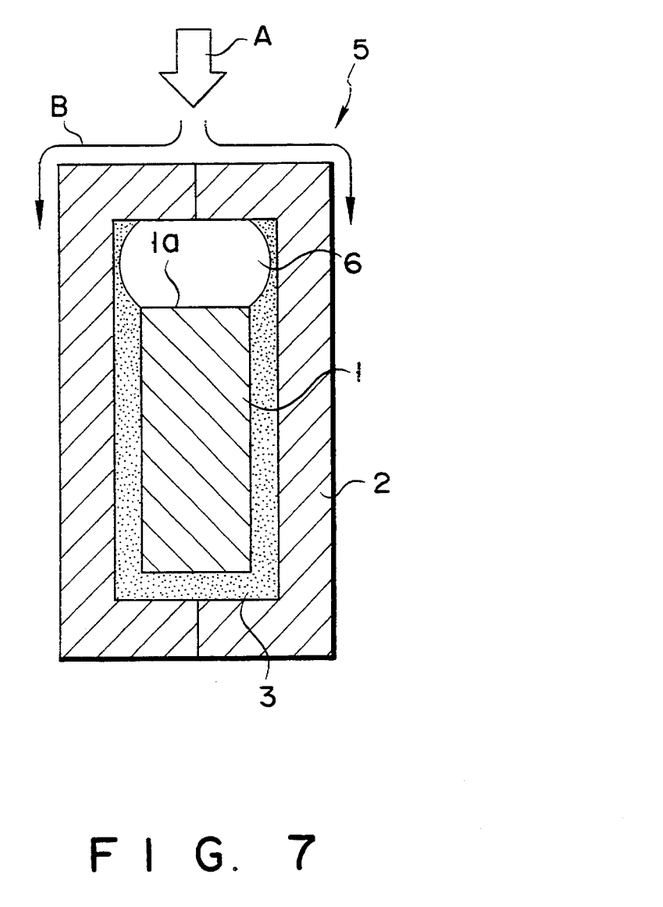
FIG. 7 is a sectional view showing the structure of a superconducting wire according to another embodiment of the present invention.

A superconducting wire 5 shown in FIG. 7 has a structure basically similar to that of the superconducting wire 4 shown in FIG. 1 except for the following respects. In FIG. 7, a load (arrow A) perpendicular to the longitudinal direction of a superconducting wire body 1 mainly acts on a surface 1a, and a space 6 is formed between this surface 1a side of the superconducting wire body 1 and a housing material layer 2. The space 6 serves to prevent the surface 1a, to which the compressive stress to the superconducting wire body 1 mainly acts, and the housing material layer 2 from being directly bonded to each other.

That is, the load (arrow A) applied on the superconducting wire 5 is received by the housing material layer 2, and the space 6 is formed on the surface 1a side to which the stress is applied. Therefore, the load is dispersed (arrow B in FIG. 7) so that it will not be directly applied on the superconducting wire body 1. As a result, a decrease in superconducting wire characteristic caused by application of the stress can be suppressed more efficiently. In this manner, the space 6 functions effectively as a stress relaxation portion. It is preferable that the gap between the superconducting wire body 1 and the housing material layer 2 is set in a similar manner to the above embodiment.

The space 6 for stress relaxation does not necessarily need to be formed such that the surface 1a to which the stress to the superconducting wire body mainly acts entirely contacts it, but a designed effect can be obtained if it is formed such that the applied load is released to the housing material layer 2. It is also preferable that the size (sectional area) of the stress relaxation space 6 is set by considering the contact area of the superconducting wire body 1 and the housing material layer 2 which is obtained because of the presence of a solder layer 3, and the volume of the solder layer 3. For example, assuming that the volume of the stress relaxation space 6 is $V_1$ and that the volume of the solder layer 3 is $V_2$, it is preferable to set $V_1/V_2$ to 3 or less. That is, if the space 6 is set excessively large, the heat transfer efficiency of the superconducting wire body 1 and the housing material layer 2 is decreased, and the function of the housing material layer 2 as the stabilizing member during quenching as well as its mechanical strength is decreased. Note that if the space 6 is excessively small, a sufficient stress relaxation effect cannot be sometimes obtained.

It is preferable that the stress relaxation space 6 is formed to be continuous in the longitudinal direction of the superconducting wire 5. If the stress relaxation space 6 is not continuous, the stress may be centered on a local contact portion, resulting in an increase in occurrence of quenching. In this manner, the stress relaxation space 6 continuously formed in the longitudinal direction of the superconducting wire 5 can be obtained by adjusting the amount of solder to be filled. Alternatively, the space 6 can be formed with good reproducibility by adopting the following method.

Figure 8:
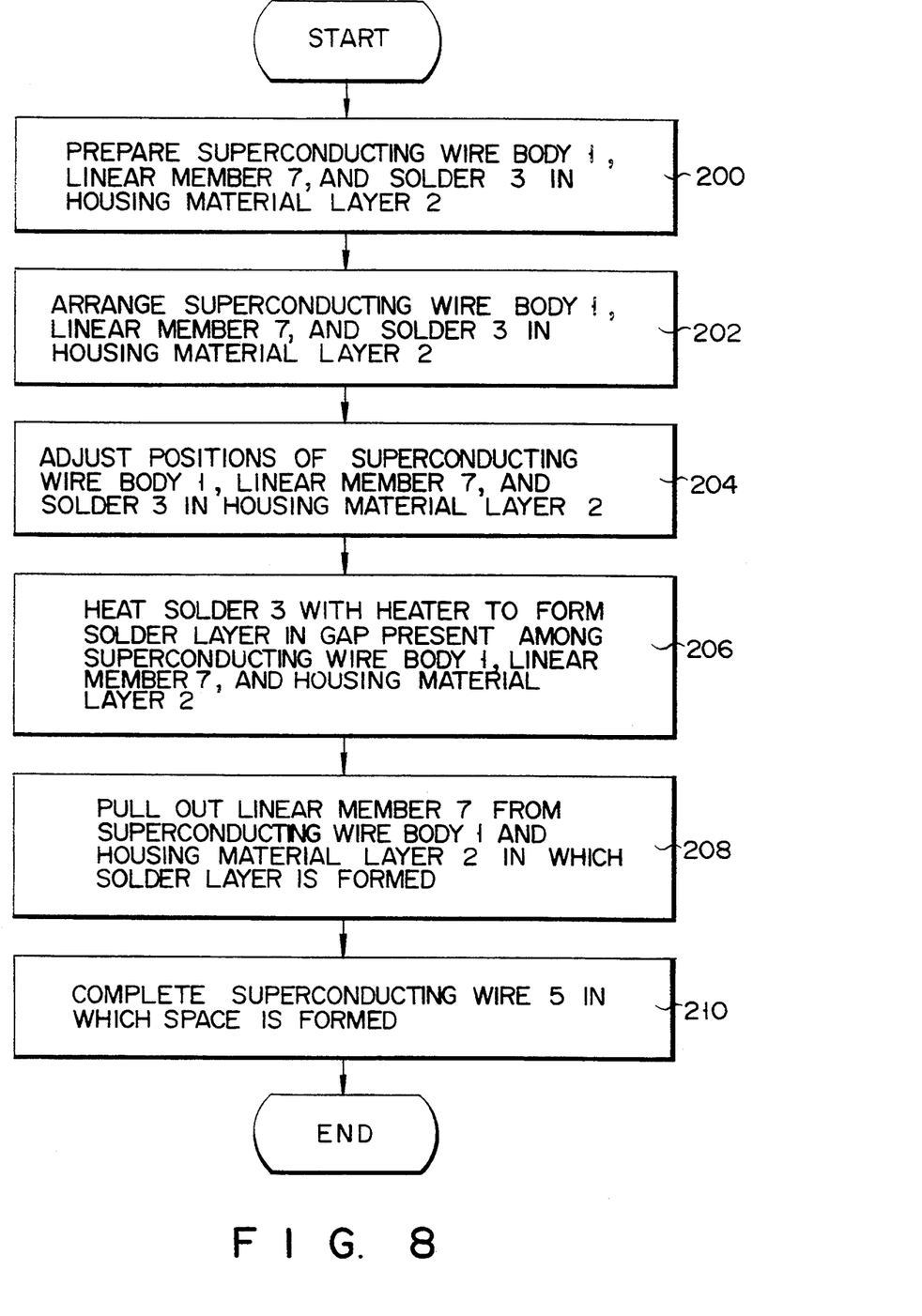
FIG. 8 is a flow chart showing Example 2 of a superconducting method of manufacturing a superconducting wire according to the present invention.
Figure 9:
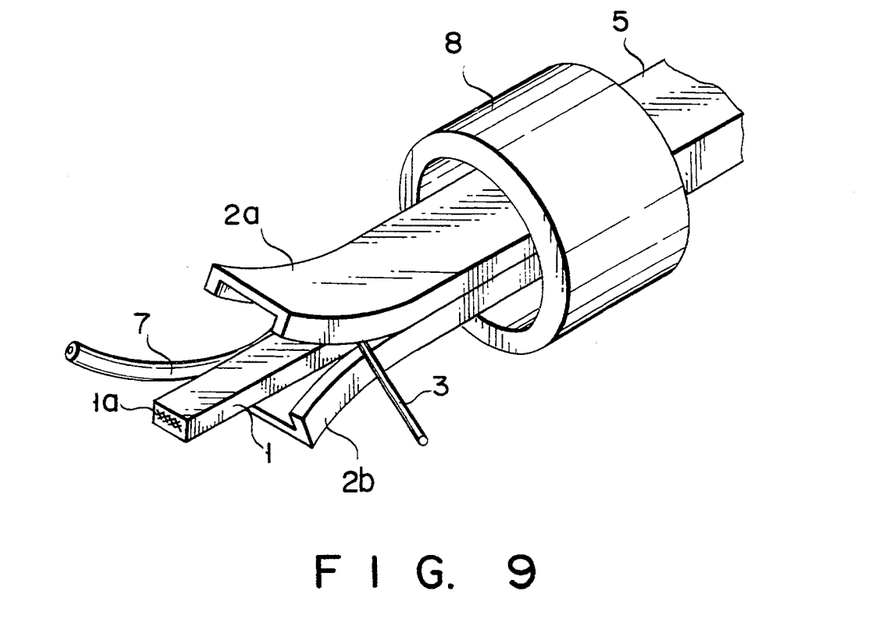
FIG. 9 is a perspective view for explaining a step in the method of manufacturing a superconducting wire according to the present invention.
Figure 10:
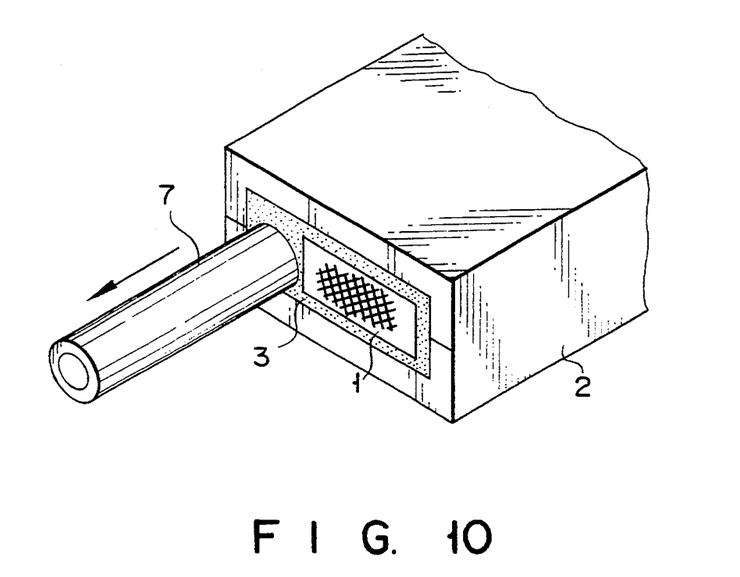
FIG. 10 is a perspective view for explaining another step in the method of manufacturing a superconducting wire according to the present invention.

That is, as shown in FIGS. 8 and 9, an elongated housing material layer 2, an elongated (linear) superconducting wire body 1, a linear member 7, and a linear solder 3 are prepared (step 200). When the superconducting wire body 1 is to be sandwiched by split housing material layers 2a and 2b, the linear member 7 having a solder non-adhesion property is inserted between a surface 1a of the superconducting wire body 1, to which the stress mainly acts, and the housing material layer 2 (step 202). The positions of the elongated (linear) superconducting wire body 1, the linear member 7, and the linear solder 3 are adjusted in the elongated housing material layer 2 (step 204). The solder 3 is heated by a heater 8 to be filled between the superconducting wire body 1 and the housing material layer 2 (step 206), thereby integrating them, and a space is formed around the linear member 7. As a result, the solder layer 3 which is provided the space is formed between the superconducting wire body 1 and the housing material layer 2 excluding a portion in which the linear member 7 having a solder non-adhesion property is inserted, thereby integrally forming a superconducting wire 5. The solder 3 does not adhere to the inserted linear member 7. Therefore, when the linear member 7 is gradually pulled out immediately after the solder 3 is solidified, as shown in FIG. 10 (step 208), the continuous stress relaxation space 6 corresponding to the section of the linear member 7 is formed. The superconducting wire 5 is thus completed (step 210).

Since the linear member 7 inserted between the housing material layer 2 and the surface 1a, to which the stress to the superconducting wire body 1 mainly acts, has the solder non-adhesion property, even if it is not pulled out as described above, desirable voids are formed around it. Therefore, it is possible to obtain an effect similar to that of the stress relaxation space 6 described above with these voids. That is, the linear member 7 having the solder non-adhesion property remains at a portion corresponding to 10 the stress relaxation space 6 of FIG. 9. In this case, the gap between the superconducting wire body 1, in which the linear member 7 having the solder non-adhesion property is to be inserted, and the housing material layer 2, is preferably 0.25 mm or more. At other portions, it is sufficient if the gap can only maintain a mechanical strength by the presence of the filled solder.

The material of the linear member 7 having the solder non-adhesion property is not especially limited as far as solder does not adhere to it. For example, aluminum, tungsten, ceramics, or the like can be used. The shape of the linear member 7 preferably has a linear or tubular shape. If the linear member 7 is a group of capillary tubes and if the linear member 7 is filled with a solder and then pulled while the capillary tubes are evacuated by a vacuum pump, an evaporation gas of the flux and the like are prevented from remaining in the stress relaxation space 6. As a result, the superconducting wire body 1 and the housing material layer 2 can be prevented from being corroded by a distillation gas in the stress relaxation space 6, and a further stabilization of the superconducting wire 5 can be performed.

Practical examples of the superconducting wire 5 having the above structure and their evaluation results will be described.

EXAMPLE 3

First, an $(Nb,Ti)_3Sn$ superconducting wire body 1 having a straight-angled section of 0.7 mm × 1.4 mm was prepared, and a housing material layer 2 covering it was set to have a thickness of about 0.5 mm. The gap between the superconducting wire body 1 and the housing material layer 2 was set to about 0.05 mm to 0.55 mm at each of the upper and lower sides of a surface 1a to which the load acts in the direction of the arrow A, and to about 0.05 mm to 0.15 mm at each of the right and left surface sides perpendicular to the direction of the arrow A.

An aluminum tube having a sectional area in accordance with the gap was inserted in the gap between the surface 1a, to which the load to the superconducting wire body 1 mainly acts, and the housing material layer 2, as shown in FIG. 10. In this state, a Pb-Sn solder was filled in the gap between the superconducting wire body 1 and the housing material layer 2. When the solder was solidified, the aluminum tube was pulled out while being evacuated to form a stress relaxation space 6. Six types of superconducting wires 5 were manufactured in this manner by changing the size of the gap.

Figure 11:
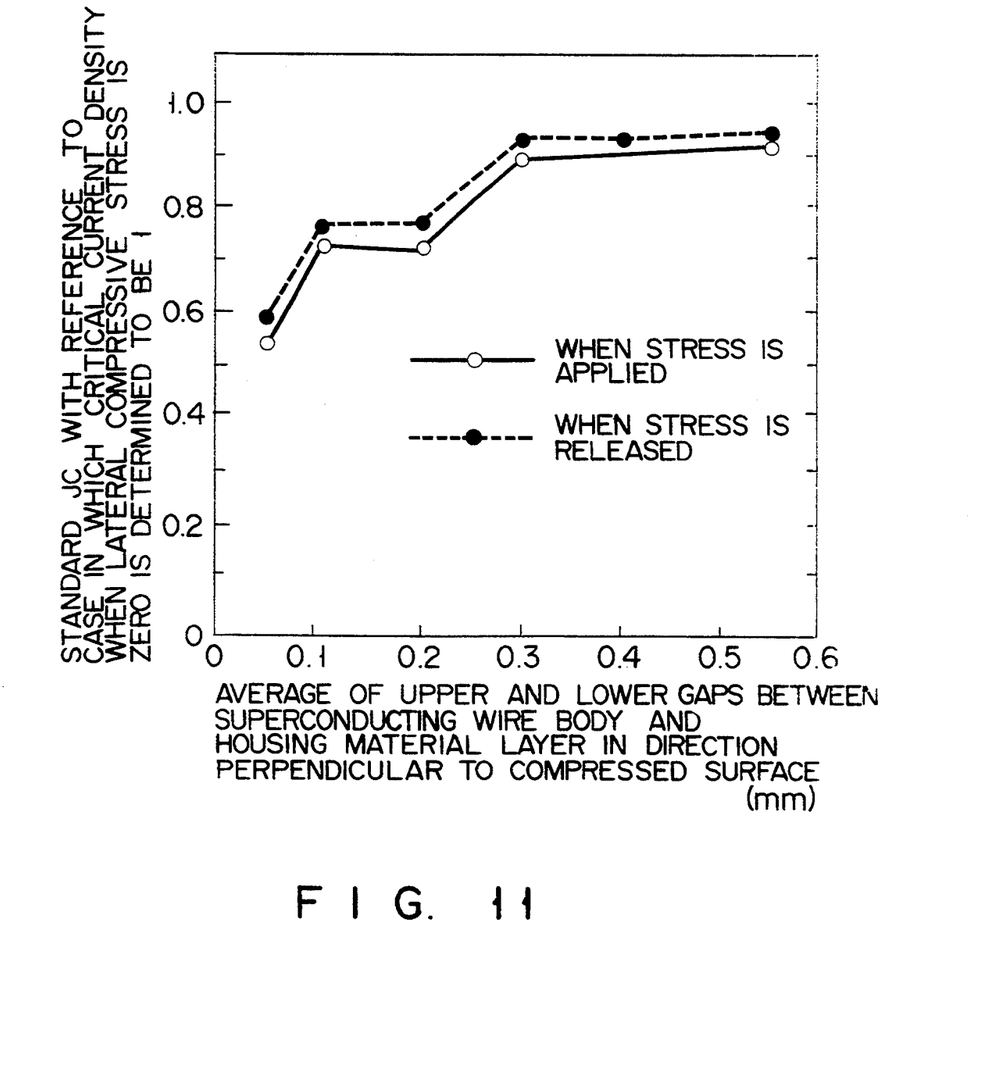
FIG. 11 is a graph showing a relationship between the critical current density and the superconducting wire body-housing material layer gap (the size of space) of the superconducting wire according to another embodiment of the present invention.

The critical current densities of these superconducting wires 5 upon application of a lateral compressive stress were examined by standardizing them with reference to the value at 14 tesla obtained when no lateral compressive stress was applied. FIG. 11 shows the result as a relationship between the standard Jc and an average of the compressive stress at upper and lower portions, along a direction perpendicular to the compressed surface, of the gap between the superconducting wire body 1 and the housing material layer 2. In FIG. 11, a hollow circle represents a measurement result obtained when a stress is applied, and a solid circle represents a measurement result obtained when the stress is released. As is apparent from FIG. 11, degradation in superconducting characteristic is further suppressed compared to Example 2 in which the solder is filled entirely in the gap between the superconducting wire body 1 and the housing material layer 2.

As has been described above, according to the present invention, a superconducting wire which has prescribed stability, no degradation due to a tensile stress in the axial direction, and considerably less degradation in characteristic caused by lateral compression can be provided with good reproducibility. Therefore, since a high critical current density can be constantly obtained regardless of the load and the like, the superconducting wire constantly exhibits a good, high-reliability function even when it is used in a large-sized superconducting magnet for nuclear fusion, a hybrid magnet, or the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A superconducting wire adapted to manufacture a coiled superconducting wire such as an electromagnet device, said superconductor wire comprising:
   a housing including at least one significant space;
   a superconducting wire body arranged in said housing, so as to leave the significant space in the housing; and
   a material filled in the significant space,
   wherein a distance between said housing and a surface of said superconducting wire body, on which a load acts in a direction perpendicular to a longitudinal direction of said superconductor wire, is set to not less than 0.25 mm and not permitted to exceed 0.7 mm.

2. A superconducting wire adapted to manufacture a coiled superconducting wire such as an electromagnet device, said superconducting wire comprising:
   a housing including at least one significant space;
   a superconducting wire body arranged in said housing, so as to leave the significant space in the housing; and
   a material filled in the significant space leaving a predetermined space formed between said housing and a surface of said superconducting wire body, a load acting in a direction perpendicular to a longitudinal direction of said superconducting wire on said superconducting wire body via the predetermined space,
   wherein a distance between a surface of said superconducting wire body, to which a load acts in a direction perpendicular to a longitudinal direction thereof, and said housing, is set to not less than 0.25 mm.

3. A superconducting wire adapted to manufacture a coiled superconducting wire such as an electromagnet device, said superconducting wire comprising:
   a housing including at least one significant space;
   a superconducting wire body arranged in said housing, so as to leave the significant space in the housing;
   a tube member arranged in a predetermined space; and
   a material filled in the significant space,
   wherein the predetermined space is formed between said housing and a surface of said superconducting wire body, on which a load acts in a direction perpendicular to a longitudinal direction of said superconducting wire via the predetermined space, and
   a distance between a surface of said superconducting wire body, to which a load acts in a direction perpendicular to a longitudinal direction thereof, and said housing, is set to not less than 0.25 mm.

4. A superconducting wire according to any one of claims 1, 2, and 3, wherein the significant space comprises a predetermined gap defined between at least one outer surface of said superconducting wire body and at least one inner surface of said housing which opposes said outer surface.

5. A superconducting wire according to any one of claims 1, 2, and 3, wherein said housing has an elongated shape, and said superconducting wire body has an elongated shape.

6. A superconducting wire according to any one of claims 1, 2, and 3, wherein said housing comprises first and second members each of a C-shaped section so that a space for storing said superconducting wire body is formed therein when said first and second members are mated.

7. A superconducting wire according to any one of claims 1, 2, and 3, wherein said material is filled in the significant space and has a good adhesion property with respect to at least one of said housing and said superconducting wire body.

8. A superconducting wire according to any one of claims 1, 2, and 3, wherein said material has a melting point lower than that of at least one of said housing and said superconducting wire body.

9. A superconducting wire according to any one of claims 1, 2, and 3, wherein said material has a good adhesion property with respect to at least one of said housing and said superconducting wire body and has a melting point lower than that of at least one of said housing and said superconducting wire body.

10. A superconducting wire according to any one of claims 1, 2, and 3, wherein said material is a material selected from the group consisting of Pb, Sn, In, Ag, Cd, and an alloy as a combination thereof.

11. A superconducting wire according to any one of claims 1, 2, and 3, wherein said housing is made of reinforced copper or alumina-dispersed reinforced copper.

12. A superconducting wire according to any one of claims 1, 2, and 3, wherein said superconducting wire body is of a copper matrix type having a right-angled section.

13. A superconducting wire according to any one of claims 1, 2, and 3, wherein said superconducting wire body comprises $(Nb,Ti)_3Sn$.

14. A superconducting wire according to claim 2, wherein the predetermined space has a section determined depending on a contact area of said superconducting wire body and said housing and a volume of said material.

15. A superconducting wire according to any one of claims 2 and 14, wherein $V_1/V_2$ is set to be not more than 3 where $V_1$ is a volume of the predetermined space and $V_2$ is a volume of a solder space.

16. A superconducting wire according to claim 3, wherein said tube member has a non-adhesion property with respect to said material.

17. A superconducting wire according to claim 3 or 16, wherein said tube member is made of aluminum or tungsten.

18. A superconducting wire according to any one of claims 1, 2 and 3, wherein said housing comprises:

at least two members positioned opposite each other for forming the significant space between the members.

19. A superconducting wire according to claim 2, wherein:

the distance between a surface of said superconducting wire body is not greater than 0.7 mm.

* * * * *